United States Patent
Blair et al.

(10) Patent No.: US 12,083,620 B2
(45) Date of Patent: Sep. 10, 2024

(54) LASER BASED MACHINING

(71) Applicant: PowerPhotonic Ltd., Dalgety Bay (GB)

(72) Inventors: Paul Blair, Dalgety Bay (GB); Chris Courtney, Dalgety Bay (GB); Tina Parsonage, Dalgety Bay (GB); Amiel Lopes, Edinburgh (GB); Krystian L. Wlodarczyk, Edinburgh (GB); Duncan P. Hand, Edinburgh (GB)

(73) Assignee: POWER PHOTONIC LTD. (GB)

( * ) Notice: Subject to any disclaimer, the term of this patent is extended or adjusted under 35 U.S.C. 154(b) by 1118 days.

(21) Appl. No.: 16/226,750

(22) Filed: Dec. 20, 2018

(65) Prior Publication Data

US 2019/0193198 A1  Jun. 27, 2019

(30) Foreign Application Priority Data

Dec. 22, 2017 (GB) ...................................... 1721709

(51) Int. Cl.
*B23K 26/0622* (2014.01)
*B23K 26/00* (2014.01)
(Continued)

(52) U.S. Cl.
CPC ...... *B23K 26/0624* (2015.10); *B23K 26/0006* (2013.01); *B23K 26/082* (2015.10);
(Continued)

(58) Field of Classification Search
CPC .............. B23K 26/402; B23K 26/0624; B23K 23/082; B23K 26/352; B23K 26/3576;
(Continued)

(56) References Cited

U.S. PATENT DOCUMENTS

| 2009/0188543 | A1* | 7/2009 | Bann | ................. | B23K 26/0665 |
| | | | | | 219/121.69 |
| 2011/0139758 | A1* | 6/2011 | Fan | .................... | H01L 31/0463 |
| | | | | | 219/121.72 |

(Continued)

FOREIGN PATENT DOCUMENTS

| CN | 103203541 A | 7/2013 |
| DE | 10 2011 103793 A1 | 9/2012 |

(Continued)

OTHER PUBLICATIONS

Marti-Lopez, L. et al, Interferometric Characterizing the smile of laser diode bars, 2007, pp. 359-371, Optics Communications 275.

(Continued)

*Primary Examiner* — Vy T Nguyen
(74) *Attorney, Agent, or Firm* — LAW OFFICE OF JESSE D. LAMBERT, LLC

(57) ABSTRACT

A direct write laser based machining process wherein a laser beam is controlled to machine a glass material in an interlaced raster scan pattern. An embodiment of machining a glass substrate to form an optical element is described. An ultrashort pulsed laser is used for machining and smoothing fused silica, followed by $CO_2$ laser polishing. High speed and high quality machining is possible using this approach, which allows efficient use of high laser repetition rates.

17 Claims, 3 Drawing Sheets

(51) Int. Cl.
| | |
|---|---|
| *B23K 26/08* | (2014.01) |
| *B23K 26/082* | (2014.01) |
| *B23K 26/352* | (2014.01) |
| *B23K 26/36* | (2014.01) |
| *B23K 26/40* | (2014.01) |
| *B23K 103/00* | (2006.01) |
| *B29D 11/00* | (2006.01) |
| *C03C 23/00* | (2006.01) |
| *G02B 27/09* | (2006.01) |
| *H01S 5/40* | (2006.01) |

(52) U.S. Cl.
CPC ........ *B23K 26/0853* (2013.01); *B23K 26/352* (2015.10); *B23K 26/355* (2018.08); *B23K 26/3576* (2018.08); *B23K 26/36* (2013.01); *B23K 26/40* (2013.01); *B29D 11/00* (2013.01); *B29D 11/00298* (2013.01); *C03C 23/0025* (2013.01); *G02B 27/0961* (2013.01); *H01S 5/4043* (2013.01); *B23K 2103/54* (2018.08); *B29D 11/00932* (2013.01)

(58) Field of Classification Search
CPC .. B23K 26/355; B23K 26/0006; B23K 26/36; B23K 26/40; B23K 2103/54; B29D 11/00; B29D 11/00298; B29D 11/00932; C03C 23/0025; G02B 27/0961; H01S 5/4043
USPC ...................................................... 264/400
See application file for complete search history.

(56) References Cited

U.S. PATENT DOCUMENTS

| | | | |
|---|---|---|---|
| 2012/0140334 | A1 | 6/2012 | McBride et al. |
| 2012/0198650 | A1 | 8/2012 | Jiang et al. |
| 2014/0138359 | A1 | 5/2014 | Carr et al. |
| 2016/0129526 | A1 | 5/2016 | Russ et al. |
| 2016/0243646 | A1* | 8/2016 | Kleinert ............. B23K 26/0853 |

FOREIGN PATENT DOCUMENTS

| | | |
|---|---|---|
| JP | 2003234306 A | 8/2003 |
| JP | 3704096 B2 | 10/2005 |

OTHER PUBLICATIONS

McBride, R. et al, Monolithic fast-axis collimation of diode laser stacks, 2013, pp. 860507-1 to 860507-9, SPIE vol. 8605.
Heidrich. S., Development of a Laser Based Process Chain Manufacturing Freeform Optics, Physics Procedia, 2011, pp. 519-528, Elsevier Ltd.
Heidrich, S. et al, Ablation and Polishing of Glass Using Laser Radiation to Manufacture Optical Components, p. 97, Fraunhofer Institute for Laser Technology ILT.
McBride, R. et al, Beamshaping for power lasers using freeform refractive optics, SPIE vol. 8963, 2014, pp. 89630C-1 to 88630C-14, SPIE.
Chiu, C. et al, Fabricating of aspheric micro-lens array by excimer laser micromachining, Optics and Lasers in Engineering, 2011, pp. 1232-1237, Elsevier Ltd.
Richmann, A. et al, Polishing of illumination optics with CO2 laser radiation, DGaO proceedings, 2012, two pages, DGaO.
Wlodarczyk, K. et al, Shaping the surface of Borofloat 33 glass with ultrashort laser pulses and a spatial light modulator, Applied Optics, Mar. 20, 2014, pp. 1759-1765, Applied Optics, Optical Society of America.
Heidrich, S. et al, Optics manufacturing by laser radiation, Optics and Lasers in Engineering, 2014, pp. 34-40, Elsevier Ltd.
Heidrich, S. et al, Laser polishing and laser form correction of fused silica optics, Mat.-Wiss. Werksttech 46, No. 7, 2015, pp. 668-674, Wiley-VCH, Weinheim.
Holmes, A., Excimer laser micromachining with half-tone masks for the fabrication of 3-D microstructures, IEE Proc.-Sci. Meas. Technol., vol. 151. No. 2, Mar. 2004, pp. 86-92, IEE.
Liu, X. et al, Laser ablation and micromachining with ultrashort laser pulses, IEEE Journal of Quantum Electronics, Oct. 1997, pp. 1706-1716, vol. 33, No. 10, IEEE.
Wlodarczyk, K. et al, Laser smoothing of binary gratings and multilevel etched structures in fused silica, Applied Optics, Apr. 10, 2010, pp. 1997-2006, vol. 49, No. 11, Optical Society of America.
Carter, R. et al, Picosecond laser welding of similar and dissimilar materials, Applied Optics, Jul. 1, 2014, pp. 4233-4238, vol. 53, No. 19, Optical Society of America.
Nowak, K. et al, Efficient laser polishing of silica micro-optics, Applied Optics, Jan. 1, 2006, pp. 162-171, vol. 45, No. 1, Optical Society of America.
Demir, A. et al, Laser micromachining of TIN coatings with variable pulse durations and shapes in ns regime, Surface & Coatings Technology, 2014, pp. 240-248, Elsevier B.V.
Pangovski, K. et al, A holographic method for optimisation of laser-based production processes, Adv. Opt. Techn., 2016, pp. 177-186, 5(2), Thoss Media.
European Patent Office, European Search Report for EP 18 21 4474, European Patent Office, May 23, 2019, two pages.
Intellectual Property Office, UK Search Report for GB1721709.2, Intellectual Property Office, Mar. 16, 2018, five pages, UK Patent Office.

* cited by examiner

LASER BASED MACHINING

FIELD OF THE INVENTION

The present invention relates to laser based machining and in particular to a direct write laser based machining process using an interlaced raster scanning technique to provide high quality and high efficiency machining of materials such as fused silica for the manufacture of optical elements.

BACKGROUND OF THE INVENTION

High quality aspheric, freeform and bespoke optics are required for a wide range of applications. One example is as correction optics for high power diode lasers to improve brightness. In this case, although standard off the shelf components can be used, since the laser characteristics differ from one device to the other, the correction provided can only be partial. The optimum solution involves measuring the output errors and producing bespoke correction optics. More generally, aspheric optics are highly desired for their ability to provide compact single component solution for the high quality imaging required in many commercial and scientific devices. Traditional methods such as grinding are limited in terms of the shapes that can be achieved, whilst precision moulding is restricted to the lower melting point glasses or polymers. Laser direct write machining processes have now been developed. Direct write is the technique of machining, marking or texturing a material wherein the substrate is placed at the focal plane of a focused laser beam and the beam is translated over the substrate by either moving the beam or the substrate with respect to the beam.

U.S. Pat. No. 8,570,657 to the present Applicant's discloses a micro-optical element for use with an edge-emitting laser diode bar stack, the element comprising a plurality of spaced apart fast-axis collimators formed as a monolithic array, wherein the plurality of fast-axis collimators each have characteristics determined by emitter locations in the measured laser diode bar stack and the spacing between the collimators in the fast-axis varies across the micro-optic element. A method of manufacturing a micro-optical element for use with a laser diode bar stack, using a wavelength stabilized $CO_2$ laser is also described. The laser, an acousto-optic modulator and a translation stage are controlled to ablate portions of a monolithic substrate in a shot by shot raster regime to form an array of predetermine lens forms on the substrate.

WO2012119761 to Fraunhofer Ges Zur Foerderung Der Angewandten Forschung EV relates to a method for producing optical elements, in which the surface of a blank is worked by means of high-energy radiation to approximate to a desired surface contour, initially by coarse removal of material. After the coarse removal, the worked surface is polished with high-energy radiation, the surface contour and surface roughness of the surface are optically measured and compared with a desired surface contour and a desired surface roughness. If the measured surface contour or surface roughness deviates from the desired surface contour and desired surface roughness outside predetermined tolerance limits, extremely fine removal of material is performed by means of high-energy radiation until the deviation lies within the predetermined tolerance limits. The method is particularly suitable for the flexible production of optical elements with diameters greater than 1 mm and aspherical or freeform surfaces.

Laser based direct write techniques using $CO_2$, excimer and ultrashort laser pulses have all been used to machine fused silica glass substrates. Ultrashort laser pulses rely on nonlinear absorption, whereas excimer and $CO_2$ lasers can process in a linear regime.

Heidrich, S., Richmann, A., Schmitz, P., Willenborg, E., Wissenbach, K., Loosen, P., Poprawe, R.: Optics manufacturing by laser radiation. Opt. Lasers Eng. 59, 34-40 (2014) describes a three step $CO_2$ laser process consisting of (i) a high speed 1.2 kW $CO_2$ laser ablation step providing material removal at a rate of 20 mm$^3$/s, followed by (ii) a 1.5 kW $CO_2$ laser polishing process by defocusing the spot to have a diameter of ds=650 µm after which (iii) a form correction process to remove waviness is carried out using an ultrafast or a $CO_2$ laser which is followed by another polishing step to remove the roughness generated by the form correction process. The high ablation rates are possible due to the high average power coupled with a laser spot diameter of 450 µm and a scan speed ranging from 1 to 10 ms$^{-1}$. However, as a thermally-driven process, this is limited to fused silica unless an additional heating arrangement is used—e.g. for machining BK7.

Chiu, C. C., Lee, Y. C.: Fabricating of aspheric micro-lens array by excimer laser micromachining. Opt. Lasers Eng. 49, 1232-1237 (2011) describes excimer lasers operating in the UV at 248 nm to micro machine glass producing very fine features. However, due to the low beam quality in this case it is necessary to use a mask-imaging process, and hence is not suitable for bespoke optics, as this would require bespoke masks.

Liu, X., Du, D., Mourou, G.: Laser ablation and micromachining with ultrashort laser pulses. IEEE J. Quantum Electron. 33, 1706-1716 (1997) uses the high peak power of ultrashort pulses, which enables multi-photon absorption, and hence machining of materials that are normally transparent at the laser wavelength. The short pulse length means that it is possible to remove material with minimal heating of the surrounding material—often described as 'cold' machining. This can hence be used on a variety of glasses where thermal expansion would normally be a problem.

Heidrich, S., Willenborg, E., Richmann, A.: Development of a Laser Based Process Chain for Manufacturing Freeform Optics. Phys. Procedia. 12, 519-528 (2011) also describes an ultrafast laser machining process using a 500 fs laser with average power of 160 W providing ablation rates of 1.5 mm$^3$ s$^{-1}$ using scan speeds of 4 to 8 ms$^{-1}$. However this process provides a surface with relatively high roughness ($R_a$ in the range 0.9-1.5 µm) which is difficult to polish to obtain acceptable smoothness.

It is an object of the present invention to provide a laser based machining process for glass materials which alleviates or mitigates at least some of the disadvantages of the prior art.

SUMMARY OF THE INVENTION

According to a first aspect of the present invention there is provided a direct write laser based machining process wherein a laser beam is controlled to machine a glass material in an interlaced raster scan pattern.

By interlacing the scan lines the negative effects associated with thermal accumulation can be overcome. This can allow increased process speed. An unexpected advantage has also been found in the increased machining depth and improved surface quality at low repetition rates.

Preferably, the interlaced raster scan pattern is a unidirectional interlaced raster scan pattern. Alternatively, the interlaced scan pattern may be a bidirectional interlaced scan pattern. In an embodiment, the interlaced raster scan pattern is a unidirectional interlaced raster scan pattern wherein, in order, first, second and third scan lines are provided and the third scan line is located between the first and second scan lines. Preferably, a first pass machines lines 1, 1+n, 1+2n, ... where n is the number of passes to create the raster scan and n is greater than 1. A second pass machines lines 2, 2+n, 2+2n, ... with line 2 neighbouring and overlapping line 1, between line 1 and line 1+n, respectively. A third pass may also be present. The third pass may machine lines 3, 3+n, 3+2n, with line 3 neighbouring and overlapping line 2, between line 2 and line 1+n, respectively.

This can be expanded to provide a general interlaced raster scan pattern described by passes, i, formed by lines: i, i+n, i+2n, i+kn, where i is the pass number and k and n are integers greater than 1.

Preferably the process includes calculating a desired contour surface for the glass material. Preferably the process includes:
(a) providing a laser beam;
(b) providing a computer controlled optical system to direct the laser beam;
(c) providing a computer controlled X-Y translation stage;
(d) locating a glass material on the translation stage;
(e) operating the computer controlled optical system and the translation stage to ablate portions of the glass material in a pattern according to the first aspect and thereby machine the desired contour surface on the glass material.

In a preferred embodiment, the process includes calculating a desired contour surface from an optical design for an optical element and the glass material is a monolithic glass substrate. In this way, a micro-optical element is produced which avoids the tooling or mask writing steps of alternative techniques and provides for faster fabrication.

Preferably neighbouring scan lines overlap. Overlapping allows contours to be machined on the glass material. Preferably, laser spots in the scan direction overlap. Preferably the overlap is between 90% and 99%.

The glass material is a glass substrate. In this way, microfluidic patterns can be generated in the glass material. Drilling, milling, texturing and engraving of the glass materials can also be achieved. More preferably the glass substrate is selected from a group comprising: fused silica, borosilicate crown glass, titanate high index glass and flint glass.

Preferably the laser is an ultrashort pulsed laser. Such an ultrashort pulsed laser may be a picosecond laser. The picosecond laser may be operated at a wavelength of 1030 nm. Alternatively the picosecond laser may be operated at a wavelength of 515 nm or 343 nm. Alternatively a nanosecond laser or a femtosecond laser can be used.

Preferably the process comprises a machining step and a smoothing step. Preferably these steps are performed using the ultrashort pulsed laser. The ultrashort pulsed laser may operate at less than 10 ps. More preferably the ultrashort pulsed laser is operated at 6 ps. Preferably the ultrashort pulsed is operated at a repetition rate in the range 200 to 400 kHz. Alternatively, the laser could operate as short as a 500 fs pulse or as high as a 1 MHz repetition rate.

Preferably an interlace pitch is between 0.5 and 1.5 times the laser spot size. More preferably the interlace pitch is equal to the laser spot size.

Preferably the machining step produces a contoured shape on the substrate with a surface roughness, Ra, in the range 0.6 µm to 1.5 µm. More preferably the range is 0.6 µm to 1.2 µm.

Preferably the smoothing step produces a contoured shape on the substrate with a surface roughness, Ra, in the range 0.4 µm to 0.6 µm. More preferably Ra is less than 0.5 µm.

Preferably the process comprises a polishing step. More preferably the polishing step is performed using a $CO_2$ laser.

Preferably the polishing step produces a contoured shape on the substrate with a surface roughness, Ra, greater than 100 nm.

Preferably ablation depths greater than 300 µm are provided. More preferably ablation depths greater than 500 µm are provided. Ablation depths as high as 1000 µm may be provided.

BRIEF DESCRIPTION OF THE DRAWINGS

Embodiments of the present invention will now be described, by way of example only, with reference to.

DETAILED DESCRIPTION OF THE INVENTION

Figure 2:
FIG. 2 is an illustration of a laser based machining process for optical elements according to an embodiment of the present invention.

Reference is initially made to FIG. 2 of the drawings which illustrates a process, generally indicated by reference numeral 10, for creating an optical element according to an embodiment of a present invention. While an optical element is described, the process may be applied to any glass material in order to achieve surface contouring and provide drilling, milling, texturing and engraving effects on the glass material. The process is particularly suited to materials with low thermal conductivity such as glass, plastic, ceramic and silicon.

In the first step 12, an optical design is created for the optical element and from this the contour shape of the optical element 16 is calculated. A laser program is generated. In known laser micromachining applications, pulsed lasers are used to remove a controlled amount of material with each pulse. In particular, by varying the location and energy of each delivered pulse, a net shape can be generated.

Figure 1:
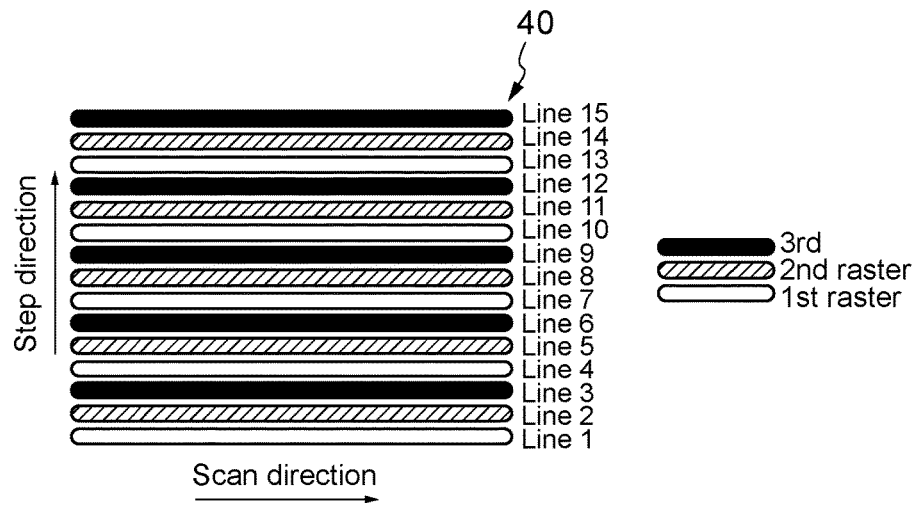
FIG. 1 is a schematic illustration of an interlaced raster scan pattern according to an embodiment of the present invention.

The laser program is input to a second step 34 which is an ultrashort pulsed laser based machining step. The second step 34 provides high speed machining of the optical element to create the desired shape. This machining is achieved using an interlaced machining technique wherein a raster scan is performed in which the scanned lines are not performed in sequence but are interlaced. This interlaced scan is as illustrated in FIG. 1.

A smoothing step is the third step 36 wherein the beam from the picosecond laser is defocussed and used to smooth out ridges created in the second step 34. A fourth step 38 is the final step, wherein a $CO_2$ laser is used to perform polishing of the optical element. A shallow melt pool is generated, causing material to re flow and reduce the roughness of the optical element.

Figure 3:
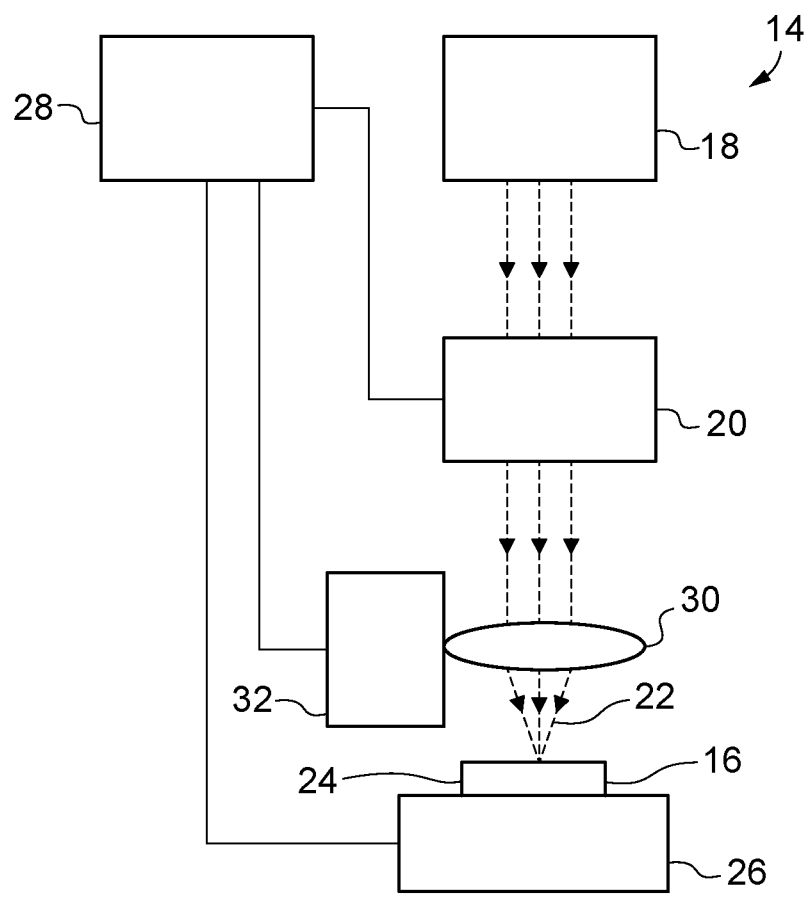
FIG. 3 is an illustration of a laser based machining system for optical elements according to an embodiment of the present invention.

The laser program of the first step 12 is input to a laser micro-machining system 14. Reference is now made to FIG. 3 of the drawings which illustrates the components of a laser micro-machining system 14, for creating a micro-optical element 16. A laser 18 is arranged before a computer 28 controlled optical assembly 20. The assembly 20 directs the output laser beam 22 to a substrate 24 upon which the desired shape will be machined. The beam 22 is translated on the substrate 24 either by using scanning optics or by translating the stage 26 or a combination of both.

The substrate 24 is fused silica (typically a piece of flat, parallel-sided fused silica 1 mm thick for elements around 5 mm in diameter). The substrate 24 may be any glass but is preferably fused silica (Corning HPFS 7980), N-BK7 (Schott Borosilicate crown glass), STIH53 (Ohara Titanate high index glass) or NLaF21 (Schott Lanthanum flint glass). The substrate 24 is mounted upon an XY translation stage 26, which is computer 28 controlled to move in steps of 100 nm in the two dimensions. A focussing lens 30 mounted on a computer controlled Z stage 32, focuses the beam 22 onto the substrate, a required depth to ablate the silica. For the first step 12, the laser 18 is a diode pumped picosecond laser that provides pulses of <10 ps, ideally 6 ps, at a maximum repetition rate of 400 kHz. The laser has an output at 1030 nm with an average power of 50 W. Second and harmonic outputs at 515 nm (average power 25 W) and 343 nm (average power 15 W) are also available for use. The computer 28 moves the stages 26,32 in a raster configuration so that controlled ablation, by pulse-by-pulse laser writing at a selected pitch, of the silica of the substrate 24 is achieved to create the desired shape. Those skilled in the art will recognise that the assembly 20 could be based around a Galvo-scanner with the substrate 24 being held in position so that the raster is created by a pass formed via the Galvo-scanner. Where a CW laser, such as a wavelength stabilised CO2 laser, is used the assembly 20 may include an acousto-optic modulator to create pulses if desired. Such a laser micro-machining system is described in U.S. Pat. No. 9,089,927 to the present Applicant's and the contents of which are incorporated herein by reference. In the present invention, the polishing step, the fourth step 38 uses a CO2 laser in CW mode.

Typically the laser beam 18 spot size on the substrate 24 corresponds to a Gaussian beam waist such that the spot profile at the surface to be machined is circular Gaussian. The measured focal spot diameters (measured at $1/e^2$) are 35.5 μm at 1030 nm ($M^2<1.3$), 20 μm at 515 nm ($M^2<1.4$) and 21 μm for 343 nm ($M^2<2.1$). The higher $M^2$ at 343 nm is due to the degradation of the third harmonic generator crystal.

In the present invention the raster configuration is not the standard line by line pattern but an interlaced unidirectional raster scan as illustrated with the aid of FIG. 1. This process employs step and scan pitches that are identical to the prior art raster scan process. However, for the first pass across the machined area, lines 1, 1+n, 1+2n, etc are machined, where n is an integer. A second machining pass is then made, where lines 2, 2+n, 2+3n etc are machined. FIG. 1 demonstrates an example of a raster scan 40 with n=3. Other numbers are available. In this way, each consecutive line is spaced apart and parallel to the preceding line, with the space being filled with further lines, the separation of which is uniform and a multiple of the line thickness i.e. laser spot size. The lines may be overlapped to reduce the ridges which will be present between neighbouring lines. The entire surface of the substrate 24 is machined to provide a raster scan 40 being a complete interlaced raster scan. While three passes are described, it will be realised that a general interlaced raster scan pattern is described by passes, i, formed by lines: i, i+n, i+2n, . . . , i+kn, where i is the pass number and k and n are integers greater than 1. The scan may be unidirectional, i.e. each line is created in the same direction, say, left to right. Alternatively, the scan may be bidirectional, allowing lines to be machined in either direction, which can speed up the process.

The process uses a special form of raster scan wherein multiple passes, five in FIG. 1, are used to obtain the final step direction overlap. Unlike the prior art sequential scan wherein the subsequent scanned lines are in sequence, the scanning technique of the present invention provides the final surface by skipping a set number of lines and machining them in subsequent passes. FIG. 1 shows an example of a surface machined using 15 lines machined in the interlaced scan technique using a 3× Δy interlace for simplicity with Δy being the distance between the centre on adjacent lines in the step direction. In the sequential scan technique commonly used, these lines would be machined in sequence from 1 to 15 using one raster or pass. In the proposed technique however, the surface is machined by the first pass with a raster pitch of 3× Δy giving lines 1, 4, 7, 10 and 13. After this, the laser spot returns to a position Δy from the first line and performs the second pass with a raster pitch of 3× Δy giving lines 2, 5, 8, 11 and 14. After this, the laser spot returns to a position 2× Δy from the first line machined and performs the third pass with a raster pitch of 3×Δy giving lines 3, 6, 9, 12 and 15. Although this example shows a 3× Δy interlaced scan for simplicity, this process can have the form of n× Δy where 'n' is an integer and n>1. The process will then be performed in 'n' number of passes. Additionally in this example a unidirectional scan is used for simplicity, nevertheless, the process can be described for both unidirectional and bidirectional scan technique in both the step and scan direction.

By separating consecutive lines so that they are not touching overheating of the substrate 24 surface is avoided. Although ultrafast or ultrashort pulsed lasers reduce thermal effects, they are not completely eliminated. The contribution of thermal accumulation in ultrashort pulsed laser processing is well-documented, and can indeed be exploited to improve efficiency for processes like welding. However thermal accumulation is a particular issue when machining glass e.g. in comparison with metals, due to their low thermal conductivity. This can lead to the formation of filamentary strands of glass, caused by the rapid solidification of molten jets of glass being ejected from the surface. Use of a lower pulse overlap provides a solution to avoid these filaments however the surface produced is rough and the process is unpredictable at lower pulse energy. The present invention gives a solution by use of the interlaced scan to provide sufficient time for the dissipation of the heat energy allowing a high effective overlap to be used, thus providing relatively smooth and predictable machining results with an $R_a$ in the range of 0.6 μm–1.2 μm.

The interlaced scan process takes advantage of the surface angle with respect to the beam. In the prior art sequential scan process, as the step pitch is small, the beam impinges on the wall of the previously machined surface. Hence, the fluence is reduced by the distorted beam and due to the angle of impinging, the debris is pushed in the direction opposite to the wall where the laser is incident on the material. In the interlaced scan technique of the present invention, due to the larger pitch used, the laser impinges on a fresh flat surface instead of the wall from the previous machining pass, hence has better absorption characteristics and the debris is better ejected away from the machined region. The interlaced scan technique also temporally separates out the machining of the region thereby reducing the thermal accumulation.

In the process, we define the laser spot as the individual spot made by each laser pulse with a laser spot diameter or size. The step pitch or interlace pitch is the distance between two subsequent scanned lines during laser machining and is the step distance determined by n. The scan pitch is the distance between two individual spots produced by subsequent laser pulses is the scan pitch. This can be set by adjusting the scan speed of the laser considering the pulse repetition rate used. The scan direction overlap is the scan pitch described in terms of overlap percentage considering the spot diameter.

In the second step 34, the interlaced machining can use parameters similar for those used in conventional raster scanning as illustrated in the following table:

| Overlap | Pitch (um) | | | Scan speed (mm/sec) | | |
|---|---|---|---|---|---|---|
| (%) | 1030 nm | 515 nm | 343 nm | 1030 nm | 515 nm | 343 nm |
| 98.75 | 0.44375 | 0.25 | 0.25 | 8.875 | 5 | 5 |
| 97.5 | 0.8875 | 0.5 | 0.5 | 17.75 | 10 | 10 |
| 95 | 1.775 | 1 | 1 | 35.5 | 20 | 20 |
| 90 | 3.55 | 2 | 2 | 71 | 40 | 40 |

The key parameters of scan overlap and step overlap are chosen in order to provide a direct comparison. However, higher repetition rate may be used with the interlacing technique, whereas in this case it is limited to 20 kHz, to prevent the ejection of glass filaments and related debris for the prior art conventional raster scanning.

The process 10 uses an ultrashort pulsed laser (a picosecond laser at 6 ps pulses) for machining with the interlaced unidirectional raster scan method as the second step 34 to create the desired optical surface shape, whilst avoiding overheating of the workpiece surface. The as-machined region has a somewhat large roughness ($R_a$ typically 1.5 µm), including clearly visible ridges.

Figure 4A:
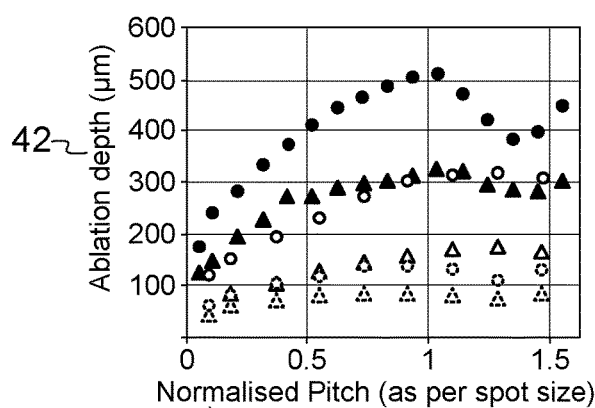
FIGS. 4(a) and 4(b) show (a) ablation depth and (b) roughness against normalised pitch (as per spot diameter) for a substrate surface machined using the method of the present invention.
Figure 4B:
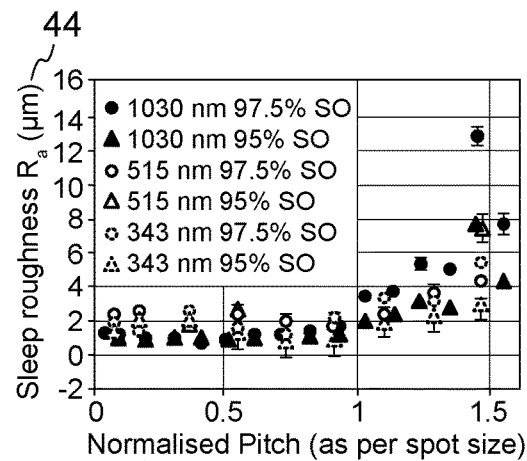

The interlace technique was tested for different step sizes in comparison with the laser spot size to determine the optimum step size for maximum depth with minimum roughness. Results are plotted in FIG. 4(a) Ablation depth (µm) 42 and (b) Roughness (µm) 44 as a function of normalized interlace pitch 46, for 1030 nm, 515 nm and 343 nm with two different overlaps (97.5% and 95%). In each case the repetition rate is maintained at 20 kHz to avoid filaments with low values of n. The results show maximum depths achievable at the longer 1030 nm wavelength with the greater overlap 97.5%. Step roughness is fairly constant to pitch size for all wavelengths. The results also show that the ablation depth is maximized when the interlace pitch is roughly equal to the spot size. The roughness is reasonably constant up to this value; for larger values of n, surface grooves are introduced, thereby significantly increasing the $R_a$ value. Hence the optimum value of interlace pitch is taken to be the laser spot size.

Figure 5:
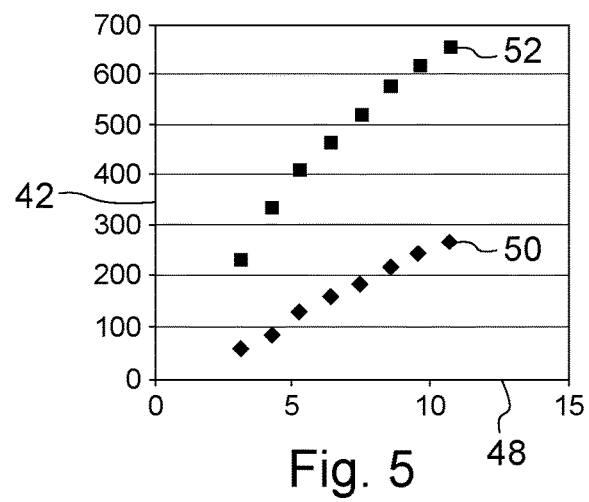
FIG. 5 shows ablation depth against fluence for a substrate surface machined using the method of the present invention and that of a standard raster scan.

The results in the following section use a constant interlace scan with 10×1.8 µm pitch. Though the machining results are optimum for interlace pitch equal to the spot diameter (20×1.8 µm for 1030 nm), these parameter maps have been created at 10×1.8 µm. To provide a direct comparison with the standard raster scan process, results are plotted in FIG. 5 for 1030 nm, using a spot size of 35 µm, 98.75% overlap for a 20 kHz repetition rate. Here the ablation depth (µm) 42 against fluence (J/cm2) 48 is plotted for a normal raster scan 50 and the interlaced raster scan 52. For the prior art raster scan 50, depths in the range 57 to 274 µm were achievable. However, for the interlaced raster scan of the present invention increased depths in the range of 240 to 660 µm were realised. This illustrates that greater ranges of ablation depths are available using the present invention. For the prior art scan raster 50, a roughness of 0.7 to 1.6 µm was recorded as compared to 1.1 to 1.5 µm for the interlaced raster scan 52. The surface roughness increase for the interlaced raster scan 52 machining can be attributed to ridges formed due to low step direction overlap.

For glass materials in particular, the high scan direction overlap allows the machining process to be more predictable by lowering the ablation threshold fluence thereby avoiding uncertain machining outcomes. Depending on the material and end result, lower scan overlap can be used. Scan overlap is not applicable to CW lasers due to the continuous nature of the output.

Figure 6A:
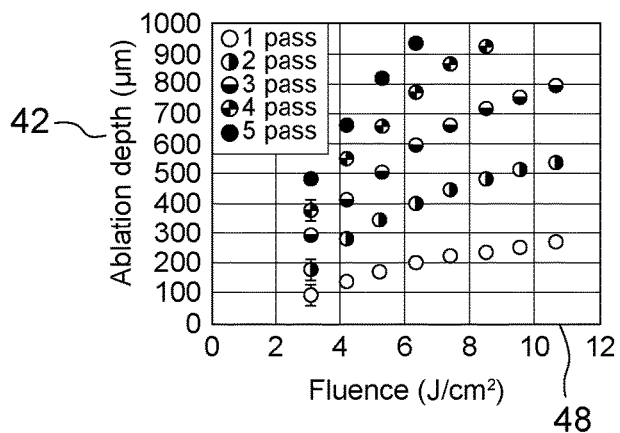
FIGS. 6(a) and 6(b) show (a) ablation depth and (b) roughness against fluence for a substrate surface machined using multiple passes with the method of the present invention.
Figure 6B:
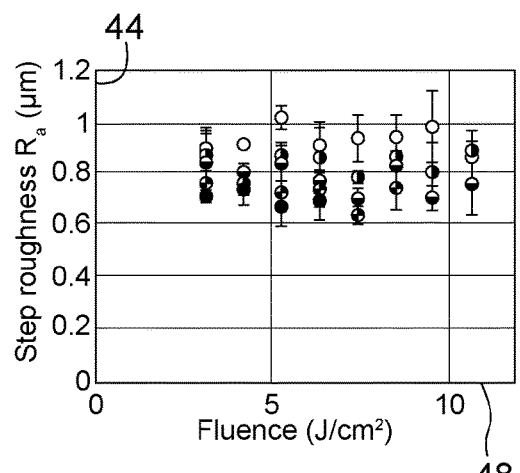

Reference is now made to FIGS. 6(a) and 6(b) which show results for multiple pass machining using the interlaced process, in order to provide a route to the generation of deeper structures. These use 1030 nm, a spot size of 35 µm, 98.75% overlap for a 20 kHz repetition rate. FIG. 6(a) plots the ablation depth (µm) 42 against fluence (J/cm$^2$) 48 and FIG. 6(b) plots step roughness $R_a$ (µm) 44 against fluence (J/cm$^2$) 48 for one to five passes. This shows that ablation depths towards 1000 µm can be obtained while the surface roughness $R_a$ is around 0.8 µm. It should be noted that the z-axis was not refocused in between scans, so the fluence reduces for subsequent passes, which reduces the removal efficiency somewhat, whilst having the positive effect of reducing the surface roughness. Hence considering the picosecond laser used, 1030 nm provides the best machining results. The interlacing scan strategy allows the use of high repetition rates while supressing the formation of filaments. Hence high repetition rates can be used along with multiple passes to get deeper structures.

The second step 34 has shown the use of the interlaced scan to provide sufficient time for the dissipation of the heat energy allowing a high effective overlap to be used, thus providing relatively smooth and predictable machining results with an $R_a$ in the range of 0.6 µm-1.2 µm. This surface roughness $R_a$ is however inadequate for microoptical elements.

An embodiment of the present invention therefore introduces a post-process smoothing step as the third step 36. This can be considered as a third stage of the process 10 flow being a "smoothing pass", where the beam 22 of the laser 18, being an ultrashort pulsed laser, is defocused to provide a spot on the machined surface of 75 µm and a sequential raster process (i.e. that of the prior art) is used with 1.8 µm step with the scan direction orthogonal to the interlace scan direction. This reduces the ridges formed by the interlaced machining process in the second step 34. Using 42 µJ pulse energy and z=focus+1 mm, produces a fluence level which causes the ablation of a small layer of the surface and the larger spot provides higher overlap thereby creating an overall smoothing effect. Hence the smoothing process can be carried out using a range of parameters (spot diameter, pulse energy, scan speed and repetition rate). However, since it does not induce melting and reflowing, the surface after the smoothing process is still optically rough, i.e. Ra of 0.6 to 0.4 µm, and so unsuitable for optical applications.

A final stage provides the fourth step 38 in an embodiment of the process 10. This uses a CO2 laser polishing process as is known in the art to provide an optically-smooth finish. The surface of the material is melted using a CO2 laser beam with care taken to keep the surface temperature below 2700° C. (vaporisation temperature). The melt pool depth, width and temperature are carefully controlled to ensure that molten glass flows under surface tension thereby eliminating the unwanted high frequency components while maintaining the surface form (i.e. the as-designed lower frequency components). An Ra better than 100 nm is obtained in this fourth step 38.

It is noted that the polishing process is only available for fused silica and is unsuitable for materials with a higher CTE.

The principal advantage of the present invention is that it provides a laser based machining process using an interlacing raster scan which increases the ablation efficiency and reduces the thermal accumulation in machining glass materials.

A further advantage of an embodiment of the present invention is that it provides a laser based machining process using an interlacing raster scan which increases the efficiency of machining optical elements.

A yet advantage of an embodiment of the present invention is that it provides a laser based machining process using an interlacing raster scan which provides increased depth control in machining optical elements.

It will be appreciated by those skilled in the art that modifications may be made to invention herein described without departing from the scope thereof. For example, other laser systems may be used to machine alternative materials with different dimensions. While the process described has been applied for ultrashort pulsed lasers it can be extended to other pulsed or CW lasers.

We claim:

1. A direct write laser based machining method wherein a single laser beam is controlled to machine a glass material in an interlaced raster scan pattern wherein a plurality of spaced apart single scan lines are machined one at a time to form a first raster pass; and wherein one or more subsequent raster passes are machined, each of said subsequent raster passes comprising a plurality of further single scan lines machined one at a time and arranged between the single scan lines of a previous raster pass.

2. The direct write laser based machining method according to claim 1 wherein the interlaced raster scan pattern is a unidirectional interlaced raster scan pattern wherein, said single scan lines pass from a first side of the glass material to a second side of the glass material in the same direction.

3. The direct write laser based machining method according to claim 1 wherein the interlaced raster scan pattern is a bidirectional interlaced raster scan pattern wherein, said single scan lines pass from a first side of the glass material to a second side of the glass material in either direction.

4. The direct write laser based machining method according to claim 1 wherein the method includes calculating a desired contour surface from a design to be machined on the glass material.

5. The direct write laser based machining method according to claim 4 wherein the method includes:
   (a) providing a computer controlled optical system to direct the laser beam;
   (b) providing a computer controlled X-Y translation stage;
   (c) locating the glass material on the computer controlled X-Y translation stage;
   (d) operating the computer controlled optical system and the computer controlled X-Y translation stage to ablate portions of the glass material in a pattern according to claim 4 and thereby machine the desired contour surface on the glass material.

6. The direct write laser based machining method according to claim 4 wherein the glass material is a glass substrate.

7. The direct write laser based machining method according to claim 6 wherein the glass substrate is selected from a group comprising: fused silica, borosilicate crown glass, titanate high index glass and flint glass.

8. The direct write laser based machining method according to claim 5 wherein the laser beam is provided by an ultrashort pulsed laser.

9. The direct write laser based machining method according to claim 4 wherein the method includes calculating a desired contour surface from an optical design for an optical element.

10. The direct write laser based machining method according to claim 5 wherein the method comprises a smoothing step.

11. The direct write laser based machining method according to claim 5 wherein an interlace pitch, being the distance between adjacent single scan lines in the interlaced raster scan pattern, is between 0.5 and 1.5 times a laser spot diameter.

12. The direct write laser based machining method according to claim 11 wherein the interlace pitch is equal to the laser spot diameter.

13. The direct write laser based machining method according to claim 10 wherein the method comprises a polishing step.

14. The direct write laser based machining method according to claim 13 wherein the polishing step is performed using a CO2 laser.

15. The direct write laser based machining method according to claim 1 wherein, in said single scan lines, ablation depths greater than 300 µm are machined in the glass material.

16. The direct write laser based machining method according to claim 15 wherein, in said single scan lines, ablation depths greater than 500 µm are machined in the glass material.

17. The direct write laser based machining method according to claim 16 wherein, in said single scan lines, ablation depths as high as 1000 µm are machined in the glass material.

* * * * *